United States Patent
Kharchenko et al.

(10) Patent No.: US 9,394,602 B2
(45) Date of Patent: Jul. 19, 2016

(54) PROCESS FOR MANUFACTURING GLAZING COMPRISING A POROUS LAYER

(75) Inventors: Andriy Kharchenko, Palaiseau (FR); Jean-Paul Rousseau, Boulogne (FR); Antje Jung, Dueren (DE); Christian Bernhard Petersen, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 56 days.

(21) Appl. No.: 14/126,767

(22) PCT Filed: Jun. 15, 2012

(86) PCT No.: PCT/FR2012/051348
§ 371 (c)(1),
(2), (4) Date: Dec. 17, 2013

(87) PCT Pub. No.: WO2012/172266
PCT Pub. Date: Dec. 20, 2012

(65) Prior Publication Data
US 2014/0120341 A1    May 1, 2014

(30) Foreign Application Priority Data
Jun. 17, 2011   (FR) ..................... 11 55329

(51) Int. Cl.
| | | |
|---|---|---|
| *C23C 14/34* | (2006.01) | |
| *C23C 14/08* | (2006.01) | |
| *C23C 14/06* | (2006.01) | |
| *C03C 17/00* | (2006.01) | |
| *C23C 14/00* | (2006.01) | |
| *C23C 14/10* | (2006.01) | |

(52) U.S. Cl.
CPC ............ *C23C 14/083* (2013.01); *C03C 17/001* (2013.01); *C03C 17/006* (2013.01); *C23C 14/0057* (2013.01); *C23C 14/06* (2013.01); *C23C 14/0605* (2013.01); *C23C 14/10* (2013.01); *C03C 2217/425* (2013.01); *Y10T 428/24997* (2015.04); *Y10T 428/249969* (2015.04)

(58) Field of Classification Search
CPC .................................................. C23C 14/0605
See application file for complete search history.

(56) References Cited

U.S. PATENT DOCUMENTS

| | | | |
|---|---|---|---|
| 4,882,827 A * | 11/1989 | Kusumi et al. | ............... 29/527.2 |
| 6,054,206 A | 4/2000 | Mountsier | |
| 6,103,363 A | 8/2000 | Boire et al. | |
| 6,214,107 B1 * | 4/2001 | Kitabatake | ...................... 117/95 |
| 6,924,037 B1 | 8/2005 | Joret et al. | |
| 6,992,284 B2 | 1/2006 | Schultz et al. | |
| 2002/0164429 A1 | 11/2002 | Gaillard et al. | |
| 2004/0115954 A1 * | 6/2004 | Todd | ............................. 438/781 |
| 2004/0235291 A1 | 11/2004 | Mandal | |
| 2005/0079201 A1 * | 4/2005 | Rathenow et al. | ............ 424/424 |
| 2005/0136240 A1 | 6/2005 | Mandal | |
| 2010/0071810 A1 | 3/2010 | Nadaud et al. | |

FOREIGN PATENT DOCUMENTS

| | | |
|---|---|---|
| EP | 1 679 291 | 7/2006 |
| EP | 1679291 A1 * | 7/2006 |
| WO | WO 00/64830 | 11/2000 |

OTHER PUBLICATIONS

Segner et al., Process for the Manufacturing of a Decrease Reflective Coating, Jul. 12, 2006, machine translation of EP1679291.*
International Search Report as issued for International Application No. PCT/FR2012/051348, dated Oct. 15, 2012.
Koep, et al., "Nanoporous films obtained by sacrificial layer pulsed laser deposition," Thin Solid Films, vol. 518, 2009, pp. 383-386.

* cited by examiner

*Primary Examiner* — Jason M Berman
(74) *Attorney, Agent, or Firm* — Pillsbury Winthrop Shaw Pittman LLP

(57) ABSTRACT

A process for manufacturing glazing including a substrate provided with a coating including a layer consisting of a porous material, includes depositing on the substrate, via a physical vapor deposition (PVD) process in a vacuum chamber, a coating including a layer of a material including an element selected from Si, Ti, Sn, Al, Zr, In or a mixture of at least two of these elements, oxygen and carbon, the layer in addition optionally including hydrogen, heat treatment of the layer thus deposited, under conditions that enable at least one portion of the carbon to be removed and the layer of porous material to be obtained, wherein the deposition is carried out, on the substrate passing through the chamber, by the sputtering of a carbon target, under a reactive plasma atmosphere including a precursor of the element or elements.

24 Claims, No Drawings

PROCESS FOR MANUFACTURING GLAZING COMPRISING A POROUS LAYER

CROSS-REFERENCE TO RELATED APPLICATIONS

This application is the U.S. National Stage of PCT/FR2012/051348, filed Jun. 15, 2012, which in turn claims priority to French Application No. 1155329, filed Jun. 17, 2011. The content of both applications are incorporated herein by reference in their entirety.

The invention relates to a process for obtaining glazing comprising a porous layer, in particular having antireflection or antisoiling properties, consisting of a porous material essentially consisting of a metal such as silicon or titanium, oxygen and optionally, in a minor amount, carbon and hydrogen. The glazing in particular finds applications in the building or motor vehicle field. It also finds an application in the devices used for collecting solar light energy, in particular in the field of photovoltaic cells or solar collectors, or else alternatively in the field of self-cleaning glazings having photocatalytic properties.

It is well known that a portion of the light passing through a substrate, especially a glass substrate, is reflected at the surface of the latter. Such a reflection substantially reduces the efficiency of the photovoltaic systems or of the solar collectors protected by the substrate. In the building or motor vehicle field, a reduction in the light reflection is also sometimes desired.

The principle of depositing an antireflection coating on a transparent substrate, typically a glass substrate, is well known from the art: it is a question of placing, on the substrate having a refractive index of around n=1.5, an interference layer or a stack of interference layers that make it possible to reduce the percentage of light $R_L$ reflected at the surface of the substrate and to increase the light transmission factor $T_L$ thereof.

By adjusting the number, the chemical nature (and therefore their optical index) and the thicknesses of the various successive layers of the stack, it is possible to reduce the light reflection to extremely low values, whether this is in the visible range (350 to 800 nm) or in the near infrared range (800 to 2500 nm).

For example, antireflection stacks comprising a succession of low index and high index layers, that make it possible to obtain glazings having antireflection properties, have already been described by the applicant company, in particular in application EP 1 206 715 A1. The various interference thin layers forming the stacks are conventionally deposited by vacuum deposition techniques of the sputtering type.

According to another technique, antireflection coatings consisting of a single layer of a material essentially consisting of porous silicon oxide have also been proposed, in particular in patent EP 1 181 256 B1. According to this prior art, the use of such a porous material, the thickness of the layer of which is adjusted as a function of the wavelength of the incident radiation, makes it possible to reduce the refractive index to values close to 1.22, and subsequently to obtain an almost zero reflection at the surface of a glass substrate having an index of 1.5, this layer retaining most of its porosity during a sintering of at least 630° C. The process for synthesizing such a layer comprises the essential step of the hydrolytic condensation via a sol-gel route of a silicon compound of $RSiX_4$ type.

Patent application EP 1 676 291 describes, still for obtaining a porous silicon oxide layer having a refractive index of less than that of the glass, processes comprising, according to a first step, the deposition on the substrate, in the vapor phase (CVD or chemical vapor deposition) or physical vapor deposition (PVD), of a primer layer of a material containing oxygen, silicon, carbon and hydrogen. According to a second step, the primer layer is subjected to a heat treatment (heating) that makes it possible to obtain, by removing at least one portion of the carbon and of the hydrogen present in the primer layer, a porous layer having a porosity of the order of one nanometer.

According to the CVD process, a gas containing the reactant is conveyed over the substrate, in the presence of heat input usually resulting from the substrate brought to temperature, and then reacts at the surface of the latter in order to form thereon the reaction product.

PVD processes encompass, in a different manner, high-vacuum coating processes, in which the material to be deposited or precursors thereof are introduced in the gas phase by physical methods such as a plasma or an ion beam, in order to then be deposited on the substrates. Among these processes, magnetron sputtering is most widely used for depositing thin layers onto a substrate: according to this process, in a vacuum chamber under a constant pressure of a plasma-generating gas, for example argon, a plasma is generated between two electrodes, by means of a direct or high-frequency voltage. The positive gas ions produced in the plasma are accelerated and strike a solid placed on the cathode, referred to as the target. The atoms torn from the solid by the impact of the argon ions diffuse in the plasma, and are deposited on the substrate placed on the anode. The atoms of the solid of the cathode may also react with additional species introduced into the plasma. This is then referred to as reactive sputtering. The final layer thus consists of a material resulting from a chemical reaction between the elements torn from the target and the gas contained in the plasma.

Very particularly, application EP 1 676 291 describes, as a possible mode, such a PVD process in which the sputtering of a target made of silicon metal or made of silica is used, in a reactive atmosphere comprising a mixture of alkenes or an alkene/oxygen mixture, in a plasma gas of argon or of an argon/oxygen mixture. An additional source of silicon may be introduced into the plasma gas, in order to increase the rate of deposition of the layer on the substrate.

However, such an embodiment poses problems in regard to the layer finally obtained: if it is chosen to use a target made of pure silicon, tests carried out have shown that it was not possible to obtain layers having a low optical index, in comparison to the optical index of the non-porous material. The expression "porous material having a "low" optical index" is understood within the meaning of the present invention to mean a material having a porosity which leads to the lowering of said index by at least 3%, 5% or even 10% with respect to the known index of the non-porous material. The expression "optical index" is understood within the meaning of the present invention to mean the optical (refractive) index measured at 550 nm.

Similarly, the use of a target made of silicon oxide is problematic because, since the material is not conductive, it forms a very poor quality cathode, leading to very low deposition rates and the presence of electrical arcs in the installation.

In addition, irrespective of the target used (silicon oxide or silicon metal), an inevitably large portion of the material deposited is dense silicon dioxide, the refractive index of which is high (1.47). Therefore, it does not appear possible according to such manufacturing techniques to in the end obtain a layer that is porous in its entirety, and consequently the lowest theoretically possible values of the refractive index.

According to another advantage, in the case of a single layer, deposited on a glass substrate, it is useful to have materials that are easy and inexpensive to deposit, the refractive index of which is lower than that of the glass substrate, so as to limit the reflection at the surface of the substrate. Alternatively, in the case of a stack of layers with an antireflection function, the provision in the stack of at least one porous layer obtained according to the invention and having an adjustable refractive index, that is to say, in particular, the index of which may be several percent lower than that of the non-porous material that forms it, makes it possible to obtain additional degrees of freedom for adjusting the antireflection effect.

Alternatively, it may also be useful to obtain outer coatings that have a functionality other than the antireflection effect. In particular, the applicant company has discovered that the process that is the subject of the invention also makes it possible to obtain porous layers comprising at least titanium as metallic element, oxygen and optionally carbon and which have photocatalytic properties, within the meaning described, for example, in patent EP 850 204 B1.

As is known, a photocatalytic layer based on titanium oxide constituted of titanium oxide may be obtained, especially crystallized in anatase form, which is the most active form. A mixture of anatase and rutile phases is also conceivable. Obtaining a porous layer according to the invention additionally has the advantage of increasing the contact area between the soiling that is deposited on the surface of the glazing and the photocatalytic particles of $TiO_2$.

The titanium oxide may be pure or doped, for example with transition metals (especially W, Mo, V, Nb), lanthanide ions or noble metals (such as for example platinum, palladium) or else fluorine. These various forms of doping make it possible either to increase the photocatalytic activity of the material, or to shift the band gap of the titanium oxide to wavelengths close to the visible range or within this range. Preferably, the photocatalytic layer based on titanium oxide does not contain nitrogen atoms, since that contributes to decreasing the optical transmission of the layer.

The layer based on titanium oxide is normally the last layer of a stack deposited on the substrate, in other words the layer of the stack furthest away from the substrate. This is because it is important for the photocatalytic layer to be in contact with the atmosphere and its pollutants. It is however possible to deposit, on the photocatalytic layer, a very thin layer, generally that is discontinuous or porous.

According to techniques already described, various layers may be deposited, additionally or alternatively, under the layer based on titanium oxide:
  one or more layers acting as a barrier to the migration of alkali metal ions originating from the substrate. Such layers may be deposited by CVD before the photocatalytic layer. They are preferably based on or constituted of an oxide, a nitride, an oxynitride or an oxycarbide of at least one of the following elements: Si, Al, Sn, Zn, Zr. Among these materials, silica or silicon oxycarbide are preferred due to their ease of deposition by the CVD technique.
  one or more low-emissivity layers, such as layers made of fluorine-doped or antimony-doped tin oxide. Such layers make it possible to limit the condensation (fogging and/or frost) on the surface of multiple glazings, in particular when they are inclined (for example when they are integrated into roofs or verandahs). The presence of a low-emissivity layer on face 1 makes it possible to limit heat exchanges with the outside during the night, and therefore to maintain a surface temperature of the glass above the dew point. The appearance of fogging or frost is therefore greatly attenuated or even completely eliminated. The photocatalytic layer may be deposited directly onto the doped tin oxide layer. The latter usually requires the less active rutile form, but the gas-phase crystallization obtained by the process according to the invention makes it possible to overcome this drawback. An additional advantage of the process according to the invention in this case is therefore that of enabling the deposition of layers in which the titanium oxide is crystallized in the (most active) anatase form and deposited directly onto a layer of doped tin oxide.

The present invention, in its most general form, proposes a process for manufacturing glazing comprising a substrate, in particular a glass substrate, provided with a coating comprising at least one porous layer in particular for which the refractive index is thus reduced thereby, comprising the following steps:
  depositing on the substrate, via a physical vapor deposition (PVD) process in a vacuum chamber, a coating comprising a layer of a material comprising at least one element selected from Si, Ti, Sn, Al, Zr, In, Zn, Nb, W, Ta, Bi, in particular Si or Ti, or the mixture of at least two of these elements, oxygen and carbon, said layer in addition optionally comprising hydrogen, said deposition being carried out, on the substrate passing through said chamber, by the sputtering of a carbon target, under a reactive, preferably oxidizing, plasma atmosphere comprising at least one precursor of the element or elements,
  heat treatment of the layer thus deposited, under conditions that enable at least one portion of the carbon to be removed and said porous layer to be obtained.

The expression "reduced refractive index" is understood to mean that the refractive index of the porous material constituting the layer is at least 3% and preferably at least 5% and very preferably at least 10% lower relative to the refractive index of the same non-porous material.

The expression "precursor of the element or elements" is understood to mean any compound that can be vaporized in the atmosphere of the reactive plasma and that contains said element or elements.

The expression "heat treatment" is understood within the meaning of the present invention to mean any process that enables the local raising of the temperature in the layer until at least one portion of the carbon initially present in said layer is removed.

Without it being considered to be a general rule, the porosimetry tests carried out by the applicant company have shown that the average size of the pores in the material thus obtained is less than 10 nm, or even less than 5 nm in the porous layer deposited by the techniques according to the invention.

The process according to the invention may advantageously be carried out according to one of the following preferred embodiments, it being clearly understood that these embodiments may be combined together, where appropriate:
  The power applied to the carbon cathode is between 0.5 and 20 kW/m, in particular between 0.5 and 5 kW/m. The polarization applied to the cathode may be direct current or alternating current.
  The total pressure of the gases in the vacuum chamber is between 0.1 and 2 Pa.
  The partial pressure of the precursor or precursors in the chamber is between 0.05 and 1.5 Pa.

According to a first embodiment, the reactive plasma atmosphere essentially consists of a neutral gas such as argon and at least one of the precursors comprises oxygen.

According to an alternative embodiment, the atmosphere of the reactive plasma comprises the mixture of a neutral gas such as argon and an oxidizing gas such as oxygen.

According to another alternative embodiment, the atmosphere of the reactive plasma essentially consists of precursors, at least one of which contains oxygen.

The heat treatment step is carried out under conditions that enable at least one portion of the carbon and of the hydrogen to be removed, until a porous layer is obtained in which the residual carbon content is less then 15 at %, preferably is less than 10 at % and very preferably is less than 5 at %.

The heat treatment of the layer is carried out between 300° C. and 800° C., for a period of less than 1 hour.

The heat treatment is carried out according to the terms defined in application EP 2 118 031.

Use is made, as the element, of silicon or of a mixture of elements predominantly including silicon. The expression "predominantly including" is understood to mean more than 50 at % of the sum of said elements present and preferably more than 80 at % or even more than 90 at % of the sum of said elements present.

Use is made, as the element, of silicon or of a mixture of elements predominantly including silicon and the heat treatment is carried out under conditions that enable at least one portion of the carbon and of the hydrogen to be removed, until a porous layer having a refractive index of less than 1.42, preferably of less than 1.40, or even of less than 1.35 is obtained.

Use is made, as the element, of silicon or of a mixture of elements predominantly including silicon and the thickness of the porous layer, after heat treatment, is between 30 and 150 nm, preferably between 50 and 120 nm.

Use is made, as the element, of titanium or of a mixture of elements predominantly including titanium. The expression "predominantly including" is understood to mean more than 50 at % of the sum of said elements present and preferably more than 80 at % or even more than 90 at % of the sum of said elements present.

Use is made, as the element, of titanium or of a mixture of elements predominantly including titanium and the heat treatment is carried out under conditions that enable at least one portion of the carbon and of the hydrogen to be removed, until a porous layer having a refractive index of less than 2.30, preferably of less than 2.20, is obtained.

Use is made, as the element, of titanium or of a mixture of elements predominantly including titanium and the thickness of the porous layer, after heat treatment, is between 5 and 120 nm, and especially between 5 and 25 nm or between 80 and 120 nm.

Use is made, as the element, of titanium or of a mixture of elements predominantly including titanium and the porous layer has a photocatalytic activity of antisoiling type.

Generally, it is possible according to the invention to use, as precursor, any organometallic compound comprising at least one atom from the element or elements selected in the preceding list and at least one group selected from alkyls (in particular methyls and ethyls), chlorine, oxygen, hydrogen, alkoxys, aromatic (phenyl) rings, alkenyls and alkynyls.

In particular, according to certain particular embodiments of the invention:

Use is made, as the element, of silicon or of a mixture of elements predominantly including silicon and the precursor or precursors are chosen from organometallic compounds of silicon, in particular selected from siloxanes, for example hexamethyldisiloxane (HMDSO), or TDMSO (tetramethyldisiloxane).

Use is made, as the element, of silicon or of a mixture of elements predominantly including silicon and the precursor or precursors are selected from alkylsilanes and silicon alcoholates, for example diethoxymethylsilane (DEMS), $Si(OC_2H_5)_4$ (TEOS), $Si(OCH_3)_4$ (TMOS), $(Si(CH_3)_3)_2$ (HMDS) $Si(CH_3)_4$ (TMS) $(SiO(CH_3)_2)_4$, $(SiH(CH_3)_2)_2$.

Use is made, as the element, of silicon or of a mixture of elements predominantly including silicon and the precursor or precursors are selected from silicon hydrides, in particular $SiH_4$ or $Si_2H_6$.

Use is made, as the element, of silicon or of a mixture of elements predominantly including silicon and the precursor or precursors are selected from silicon chlorides, in particular $SiCl_4$, $CH_3SiCl_3$, $(CH_3)_2SiCl_2$.

According to other particular embodiments of the invention:

Use is made, as the element, of titanium or of a mixture of elements predominantly including titanium and the precursor or precursors of titanium are chosen from organometallic compounds of titanium or titanium alkyl compounds and/or titanium alcoholates, in particular Ti tetraisopropylate, diisopropoxytitanium bis(acetylacetonate) and titanium tetraoctylene glycolate, titanium acetylacetonate, titanium methylacetoacetate, titanium ethylacetoacetate and titanium chloride $TiCl_4$.

The invention also relates to the glazing capable of being obtained according to the process as disclosed previously.

In particular, the invention relates to a glazing comprising a coating consisting of at least one layer of a porous material essentially consisting of silicon, oxygen and optionally carbon and hydrogen, having a refractive index of less than 1.40, capable of being obtained by a process as described previously.

The invention additionally relates to a glazing comprising a coating consisting of at least one layer of a porous material essentially consisting of titanium, oxygen and optionally carbon and hydrogen, which has photocatalytic properties and is capable of being obtained by a process as described previously.

The invention and its advantages will be better understood on reading the non-limiting examples that follow.

EXAMPLES

Various layers according to the invention were deposited on substrates made of soda-lime glass having a thickness of 4 mm, sold under the reference PLANILUX® by the applicant company, in magnetron sputtering chambers. Before each deposition, a residual vacuum is created in the chamber, until a value of 0.5 millipascal (mPa) is achieved, according to techniques well known in the field. A carbon target is installed on the cathode according to the invention. Various gas mixtures comprising an organometallic compound of silicon (HMDSO: hexamethyldisiloxane) as a source of silicon, as a mixture optionally with argon or an argon/oxygen mixture as carrier gases are introduced into the chamber, until a total pressure of the gases varying between 2 and 10 mTorr (0.27 to 1.33 Pa) is achieved.

Flow rates of the Ar and $O_2$ gases are given in Table 1 which follows. The flow rate of the precursor is adjusted so that its partial pressure in the chamber is maintained between 0.05 and 1 Pa.

The plasma is ignited and a power of 520 W/m to 1110 W/m is applied to the carbon cathode, with a pulse frequency of 50 kHz and an inverse pulse duration of 10 µs.

The ribbon of glass passes opposite the cathode. A layer of the material produced by the reaction of the carbon atoms sputtered from the target with the HDMSO in the reactive plasma is finally deposited on the substrate, the rate of which is adjusted in order to achieve a layer thickness of a few tens of nanometers.

The substrate thus coated is then subjected to a heat treatment consisting in heating at 620° C. for 10 minutes.

Table 1 which follows summarizes the experimental data for each of the glazings produced according to the invention:

TABLE 1

| Example | Flow rate (sccm) $O_2$ | Flow rate (sccm) Ar | Total pressure (mTorr) | Cathode power watt/m | Frequency (kHz) | Substrate speed (mm/s) |
|---|---|---|---|---|---|---|
| 1 | 0 | 50 | 5 | 520 | 50 | 1 |
| 2 | 0 | 50 | 2 | 520 | 50 | 0.5 |
| 3 | 0 | 50 | 10 | 550 | 50 | 1 |
| 4 | 0 | 20 | 5 | 1110 | 50 | 1 |
| 5 | 0 | 20 | 5 | 1110 | 50 | 1 |
| 6 | 5 | 20 | 5 | 1110 | 50 | 1 |
| 7 | 5 | 2 | 3 | 1110 | 50 | 1 |
| 8 | 0 | 0 | 5.5 | 1110 | 50 | 1 |
| 9 | 0 | 0 | 3 | 1110 | 50 | 1 |
| 10 | 0 | 0 | 5.5 | 1110 | 50 | 1.6 |
| 11 | 5 | 20 | 5 | 1110 | 50 | 1.3 |
| 12 | 0 | 20 | 5 | 1110 | 50 | 1.3 |
| 13 | 0 | 50 | 2 | 520 | 50 | 0.25 |

For all the examples, the refractive index of the layer deposited on the substrate was measured before and after the step of heat treatment at 620° C. The refractive indices are measured according to the present invention at 550 nm, according to the DIN 67507 standard.

The results are given in Table 2 below:

TABLE 2

| Example | Index n before annealing | Index n after annealing | Layer thickness before annealing (nm) | Layer thickness after annealing (nm) |
|---|---|---|---|---|
| 1 | 1.47 | 1.26 | 54 | 45 |
| 2 | 1.50 | 1.28 | 58 | 51 |
| 3 | — | 1.34 | — | 40 |
| 4 | 1.59 | 1.31 | 61 | 47 |
| 5 | 1.53 | 1.32 | 151 | 123 |
| 6 | 1.44 | 1.31 | 119 | 91 |
| 7 | 1.46 | 1.33 | 103 | 82 |
| 8 | — | 1.32 | — | 100 |
| 9 | — | 1.34 | — | 52 |
| 10 | 1.49 | 1.32 | 138 | 77 |
| 11 | 1.48 | 1.37 | 140 | 101 |
| 12 | 1.54 | 1.33 | 126 | 105 |
| 13 | 1.56 | 1.36 | 109 | 92 |

The results listed in Table 2 surprisingly show that the use of a process via sputtering techniques according to the invention in which, quite novelly, a carbon target is used in combination with a plasma containing an organometallic compound of silicon, makes it possible to obtain layers essentially made of porous silica having a low refractive index, that is to say having a refractive index of less than 1.42, or less than 1.40 or even less than 1.35.

The present invention is described in the foregoing by way of example. It is understood that a person skilled in the art is able to perform variants of the invention without however departing from the scope of the patent as defined by the claims.

The invention claimed is:

1. A process for manufacturing glazing comprising a substrate provided with a coating comprising at least one layer consisting of a porous material, for which the refractive index is thus reduced thereby, comprising:
   depositing on the substrate, via a physical vapor deposition (PVD) process in a vacuum chamber, a coating comprising a layer of a material comprising at least one element selected from Si, Ti, Sn, Al, Zr, In or a mixture of at least two of said elements, oxygen and carbon, said layer in addition optionally comprising hydrogen,
   heat treatment of the layer thus deposited, under conditions that enable at least one portion of the carbon to be removed and said layer of porous material to be obtained,
   wherein said deposition is carried out, on the substrate passing through said chamber, by the sputtering of a carbon target, under a reactive, plasma atmosphere comprising at least one precursor of the element or elements.

2. The process as claimed in claim 1, wherein the power applied to the cathode is between 0.5 and 20 kW/m.

3. The process as claimed in claim 1, wherein the total pressure of the gases in the vacuum chamber is between 0.1 and 2 Pa.

4. The process as claimed in claim 1, wherein the partial pressure of the precursor or precursors in the chamber is between 0.05 and 1.5 Pa.

5. The process as claimed in claim 1, wherein the reactive plasma atmosphere essentially consists of a neutral gas such as argon and at least one of the precursors comprises oxygen.

6. The process as claimed in claim 1, wherein the atmosphere of the reactive plasma comprises the mixture of a neutral gas such as argon and an oxidizing gas such as oxygen.

7. The process as claimed in claim 1, wherein the atmosphere of the reactive plasma essentially consists of precursors, at least one of which contains oxygen.

8. The process as claimed in claim 1, wherein the heat treatment is carried out under conditions that enable at least one portion of the carbon to be removed, until a porous layer is obtained wherein the carbon content is less than 15 at %.

9. The process as claimed in claim 1, wherein the heat treatment of the layer is carried out by heating between 300° C. and 800° C., for a period of less than 1 hour.

10. The process as claimed in claim 1, wherein use is made, as the element, of silicon or of a mixture of elements predominantly including silicon.

11. The process as claimed in claim 10, wherein the heat treatment is carried out under conditions that enable at least one portion of the carbon and of the hydrogen to be removed, until a porous layer having a refractive index of less than 1.42 is obtained.

12. The process as claimed in claim 10, wherein the precursor or precursors are chosen from organometallic compounds of silicon, alkylsilanes, silicon alcoholates, or silicon hydrides, or silicon chlorides.

13. The process as claimed in claim 10, wherein the thickness of the porous layer, after heat treatment, is between 30 and 150 nm.

14. The process as claimed in claim 1, wherein use is made, as the element, of titanium or of a mixture of elements predominantly including titanium.

15. The process as claimed in claim 14, wherein the heat treatment is carried out under conditions that enable at least one portion of the carbon and of the hydrogen to be removed, until a porous layer having a refractive index of less than 2.30 is obtained.

16. The process as claimed in claim 14, wherein the precursor or precursors of titanium are chosen from organometallic compounds of titanium or titanium alkyl compounds and/or titanium alcoholates.

17. The process as claimed in claim 14, wherein the porous layer has a photocatalytic activity of antisoiling type.

18. The process as claimed in claim 1, wherein the substrate is a glass substrate.

19. The process as claimed in claim 1, wherein the plasma atmosphere is oxidizing.

20. The process as claimed in claim 12, wherein the organometallic compounds of silicon include siloxanes selected from the group consisting of hexamethyldisiloxane (HMDSO), and TDMSO (tetramethyldisiloxane), wherein the alkylsilanes are selected from the group consisting of diethoxymethylsilane (DEMS), $Si(CH_3)_3)_2$ (HMDS), $Si(CH_3)_4$ (TMS), $(SiO(CH_3)_2)_4$, and $(SiH(CH_3)_2)_2$, wherein the silicon alcoholates are selected from the group consisting of $Si(OC_2H_5)_4$ (TEOS), and $Si(OCH_3)_4$ (TMOS), wherein the silicon hydrides are selected from the group consisting of $SiH_4$ and $Si_2H_6$, and wherein the silicon chlorides are selected from the group consisting of $SiCl_4$, $CH_3SiCl_3$, $(CH_3)_2SiCl_2$.

21. The process as claimed in claim 16, wherein the precursor or precursors of titanium are selected from the group consisting of Ti tetraisopropylate, diisopropoxytitanium bis (acetylacetonate) and titanium tetraoctylene glycolate, titanium acetylacetonate, titanium methylacetoacetate and titanium ethylacetoacetate.

22. The process as claimed in claim 8, wherein the heat treatment is carried out under conditions that enable at least one portion of the carbon to be removed, until a porous layer is obtained wherein the carbon content in the porous layer is less than 10 at %.

23. The process as claimed in claim 22, wherein the heat treatment is carried out under conditions that enable at least one portion of the carbon to be removed, until a porous layer is obtained wherein the carbon content in the porous layer is less than 5 at %.

24. The process as claimed in claim 1, wherein said deposition is carried out, on the substrate passing through said chamber, by the sputtering of a carbon target, under a reactive, plasma atmosphere comprising at least one precursor of Si, argon, and oxygen.

* * * * *